US006918676B2

(12) United States Patent
Moelle et al.

(10) Patent No.: US 6,918,676 B2
(45) Date of Patent: Jul. 19, 2005

(54) OBJECT WHICH HAS OPTICAL LAYERS

(75) Inventors: Christopher Moelle, Bad Gandersheim (DE); Thomas Küpper, Bad Gandersheim (DE); Lars Bewig, Bad Gandersheim (DE); Wolfram Maring, Bad Gandersheim (DE); Jochen Heinz, Vendersheim (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/637,203

(22) Filed: Aug. 8, 2003

(65) Prior Publication Data

US 2004/0047059 A1 Mar. 11, 2004

Related U.S. Application Data

(62) Division of application No. 09/872,049, filed on Jun. 1, 2001, now Pat. No. 6,629,763.

(30) Foreign Application Priority Data

Jun. 17, 2000 (DE) ........................................... 10 29 905
Mar. 29, 2001 (EP) ........................................... 01107966

(51) Int. Cl.[7] ............................................. G02B 7/182
(52) U.S. Cl. ..................................... 359/883; 359/884
(58) Field of Search ............................. 359/883–884, 359/871–872, 853, 856–858, 845, 584, 848, 585

(56) References Cited

U.S. PATENT DOCUMENTS 3,944,320 A    3/1976  McLintic .................... 359/360
4,830,873 A    5/1989  Benz et al. ................... 427/35
5,068,021 A   11/1991  Sichmann et al. ..... 204/192.14
5,074,984 A   12/1991  Sichmann et al. ..... 204/192.14
5,154,943 A   10/1992  Etzkorn et al. ............. 427/569
5,216,542 A    6/1993  Szczyrbowski et al. ..... 359/588
5,300,352 A    4/1994  Honma ....................... 428/212
5,423,974 A    6/1995  St.-Amant et al. ............ 205/50
5,480,687 A    1/1996  Heming et al. ............. 427/573
5,900,285 A    5/1999  Walther et al. ............. 427/491
5,945,177 A    8/1999  Hack et al. ................. 427/575
6,025,013 A    2/2000  Heming et al. ................ 427/9
6,325,517 B1  12/2001  Kuo ........................... 359/838
6,344,288 B1   2/2002  Oyama et al. .............. 428/701
2003/0021909 A1 1/2003  Danielzik et al. ........... 427/569

FOREIGN PATENT DOCUMENTS

DE      34 13 019        10/1985
DE      40 08 405         7/1991
DE      40 04 116         8/1991
DE     195 23 442         1/1997
DE     197 03 538         8/1998
DE     100 10 766        10/2001
EP       0 422 323        4/1991
EP       1 067 407        1/2001
WO     WO 95/26427       10/1995
WO     WO 96/27690        9/1996
WO     WO 99/44080        9/1999

*Primary Examiner*—Mohammad Sikder
(74) *Attorney, Agent, or Firm*—Baker & Daniels

(57) ABSTRACT

The invention relates to a process for producing an object which has optical layers. According to the invention such a process comprises the following process steps: To a substrate of plastic material several optical layers are applied; the optical layers are applied by means of a chemical plasma-impulse vaporization (PICVC).

12 Claims, 2 Drawing Sheets

OBJECT WHICH HAS OPTICAL LAYERS

CROSS-REFERENCE TO RELATED APPLICATION

This is a Division of patent application Ser. No. 09/872,049, filed Jun. 1, 2001, now U.S. Pat. No. 6,629,763.

The invention relates to an object, comprising a substrate of a plastic material, as well as a plurality of optical layers. Such objects can be optical components such as lenses, prisms, reflectors.

A reflector comprises an essentially funnel-like base body which is reflectingly coated on its inner surface. Reflectors of this type are components of lamps of every possible type, such as, for example, spotlights. They consist of the materials glass, metal or plastic. The metal and plastic reflectors used in the automobile sector are provided with a metallic reflecting surface, which also reflects heat radiation.

In the zone of such reflectors considerable amounts of heat occur, which lead locally to temperatures of up to 200° C. If the reflectors are made of glass, then no problems arise with respect to the temperatures mentioned.

Cold-light coated reflectors of glass substrates are found today, inter alia, in the general illumination field or in the stage lighting field. The cold-light coating there reflects only the visible radiation and transmits the heat radiation.

By reason of today's spotlight geometries in motor vehicles with metallically coated reflectors, the infrared radiation reflected in this way leads to locally high thermal loads on components that follow in the beam path, such as, for example, lenses, covering panes and others. By reason of this load today these components as a rule have to be used as glass substrates and/or be protected by special coatings against the heat radiation.

In the automobile industry it is increasingly a matter of the saving of weight, since a weight reduction contributes to the saving of fuel. For this reason attempts are made insofar as possible to use plastic as a substitute material for other materials, for example, for steel. In the case of the glass reflector, however, so far this was not possible. The reflecting surface, namely, would have to be provided with a cold-light mirror. So far this has failed because it was not possible to fix such a cold-light mirror lastingly on a plastic.

There are also known processes for the production of objects comprising plastic material substrates with layers located on them. Such a process is described in DE 195 23 444 A1. There a plastic is provided with a protective layer—by means of a plasma-supported CVD process (PACVDprocess)—by an electric high-frequency discharge at a reduced gas pressure. There it is a matter of achieving as high as possible a viscosity of this layer for the avoidance of embrittlement.

DE 197 03 538 A1 describes a process for modifying surfaces of PMMA substrates. Here the substrate surface is provided with a protective layer. Therewith it is supposedly possible to achieve an improved adhesion of function layers subsequently to be applied. The applying of the protective layer mentioned presents an additional process step and means, therefore, additional expenditure and costs.

Further processes for applying thin layers to plastic substrates are described in DE 34 13 019 A1, EP 0 422 323 A1, DE 04 116 A1 and others. There it is also a matter, inter alia, of the adhesion of the layer that is applied to the substrate and, namely, by means of the CVD or sputter process. DE 100 10 766 shows and describes a process and a device for coating in particular curved substrates, for example, of eyeglasses.

The processes used hitherto have not been satisfactory. The necessary adhesive strength was not achieved. On the contrary, with objects produced in such manner there is the danger of the detaching of the intermediate layer mentioned, and therewith of the entire layer pack. This can lead to the result that the object will become prematurely unusable.

Underlying the invention is the problem of giving a process with which a substrate of plastic can be lastingly and dependably provided with optical layers. In particular there is to be achieved herewith a permanent bonding of the layers to the substrate as well as of the layers among one another.

This problem is solved by the features of the independent claims.

The inventors have perceived that a lasting and dependable fixing of the alternating layers to the plastic as well as of the alternating layers among one another is attainable if the alternating layers are applied to the plastic substrate with a quite definitive process, namely by means of the so-called PICVD process (chemical plasma impulse vaporization).

In the hitherto used processes for applying layers to a substrate the interface of the substrate is disturbed or destroyed in its structure by the associated energy burden. This results in a reduction of the adhesiveness between substrate and adjoining layer. The inventors have perceived, accordingly, that the energy load which is associated with the plasma discharge must be minimized in order to enhance the adhesion. There it is a matters both of the quantity of the applied energy as well as also of the maimer of its application. The admissible limit value of the load for achieving an adhesion sufficient in practice can be determined by experiment.

By the invention there can be utilized the advantages known per se of plastic material, in particular the low weight and the easy deformability, which plays a special role in automobile manufacture, as well as the avoidance of the hazards that are associated with the splintering of glass. Furthermore, if need be, it is possible to forgo the use of grounding layers such as grounding lacquers.

As plastic material there come into consideration high-performance plastics which are stable if possible up to a temperature of 100 degrees Celsius or above. Here again the PICVD process works out favorably, since the substrate temperature is kept relatively low. The layers generated are themselves hard and lasting.

As especially good as plastic materials, there have proved the following substances:

Cycloolefin polymers (COP)

Cycloolefin copolymers (COC)

Polymethyl methacrylate (PMMA), or derivatives thereof.

Several properties of the COP and COC plastics make components of COP-COC plastics with optical interference layer systems especially well suited for their use as optical components with or without treatment or coating:

(i) High transparency with visible and near (nahmen) infrared spectral range, low double refraction—low light losses and low heating-up by heat absorption (ii) High thermal form stability (iii) Components made of COP/COC can be produced with a precision to that of glass (iv) Barrier effect especially against water vapor—advantageous for good adhesion of layer systems By reason of the properties mentioned COP and COC plastics can in many cases replace glass substrates and they therewith open up new possibilities in the design and layout of optical systems. In combination with specially adapted interference layer systems, high-quality optical components are producible.

With the PICVD process one has in hand a coating technology which, besides for the coating of glass and the like, is also excellently suited to the coating of plastic. An example of application for this is a plastic reflector with cold-light reflection, such as is of interest above all for the automobile industry. Cold-light coated reflectors of glass substrates are found today inter alia in the general illumination sector or in the stage-lighting sector. The cold-light coating there reflects only the visible radiation and transmits the heat radiation.

By reason of today's headlight geometries in motor vehicles with metal coated reflectors the infrared radiation in this manner leads to high thermal loads on components that follow in the beam path, such as, for example, lenses, covering panes and the like. Because of this load, today these components must be installed as a rule as glass substrates and/or be protected against heat radiation by special coatings.

In the automobile industry it is increasingly a matter of the saving of weight, since a weight reduction contributes to the saving of fuel. For this reason attempts are made insofar as possible to use plastic material as a substitute for other materials, for example, for steel. In the case of the glass reflectors, however, this was hitherto not possible. The reflecting surface, namely, would have to be provided with a cold-light mirror. So far this has failed because it was not possible to fix such a cold-light mirror lastingly onto a plastic material.

According to the invention, therefore, the base body of the reflector is made of plastic material, with all its advantages which consist above all in a low specific weight and a low deformability. Also, the problem of splintering protection is eliminated.

Further, according to the invention the reflecting surface is constructed as a cold-light mirror. It consists suitably of a plurality of layers with different refraction coefficients. This coating reflects the visible radiation and lets the infrared radiation be transmitted (cold-light mirror principle).

According to the invention it has proved that the alternating layers are fixable dependably and durably to the plastic material, and, namely, if they are applied with quite definite processes to the plastic substrate, namely, by means of the plasma-impulse process or by means of chemical vaporization or by means of plasma-impulse chemical vaporization.

Because of the temperature load only high-performance plastics come into considerations that are stable at least up to 100° C., and better higher. In order to apply hard lasting cold-light layer systems, as a rule high thermal loads on the substrate are required, which a plastic reflector does not endure without damage. Here the PICVD process offers itself, which as a pulsed process brings about only a slight energy charge into the substrate and thus keeps the substrate temperature low. On the other hand, in the pulses high plastic energy densities are generated that produce strong and durable layers. The coating is, as mentioned, a multiple coating. The individual layers are optical functional layers such as, for example, an anti-reflex layer, but also multifunction layers with special mechanical properties such as for example a hydrophobe cover layer, the so-called cleaning layer, which can easily be cleaned mechanically. Also layers with special optical and other properties come into consideration. Between the functional layers and the substrate there is generally applied a so-called bonding agent layer, here quite generally called "interlayer". This has a decisive importance for the usefulness of the entire product. It is responsible, namely, for the adhesion of the entire coating pack to the substrate. The interlayer can be a single homogeneous layer. It can also be a multiplex layer. There the individual layers form a gradient proceeding from a layer that follows immediately upon the substrate and, as an organicum, is identical or similar to a layer that is close to the next-following functional layer and is identical or similar to this as an inorganicum (Anorganikum).

Further, the invention is usable with every type of coating. The coating properties can be controlled by the raw materials used as well as by the operating parameters of the installation. The layer properties can vary within wide limits. The interlayer will in general be a so-called gradient layer, which is composed of several layers, and in which the layer near the substrate is essentially identical to the substrate, and the layer remote from the substrate is essentially identical to the functional layers.

The invention can also be used with application of the so-called remote-PICVD process. Here, as is well known, plasma space and coating space are separate from one another. From the plasma space excited species are led into the coating space.

The invention is explained in detail with the aid of the drawing. Therein in detail the following is represented:

Figure 1:
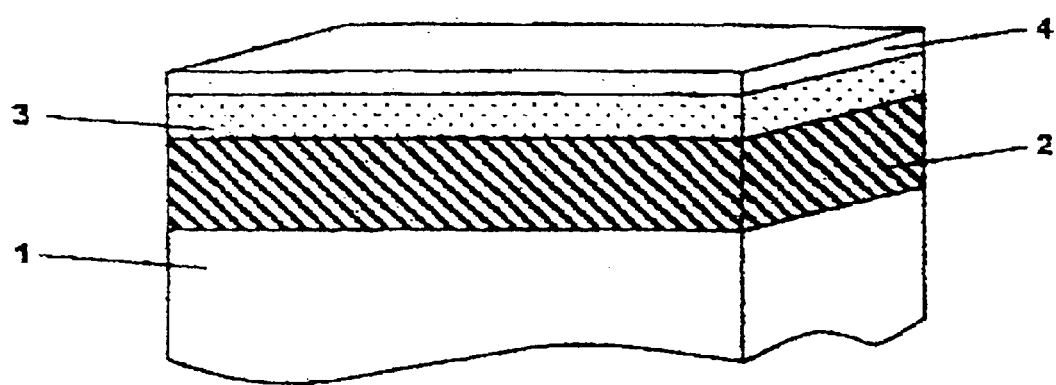
FIG. 1 illustrates in a perspective section representation a body according to the invention.

In FIG. 1 there is perceived a substrate 1. To this an interlayer 2 is applied. This has a bonding-antiscratching function. It is dependably anchored to the substrate, because, according to the invention, it was applied to the substrate with minimal energy load.

The interlayer 2 can be a so-called gradient layer, built up from several individual layers of different composition. There the individual layer near the substrate is identical in character to the substrate 1, while the upper layer, remote from the substrate, is essentially identical to a following layer.

The following layer is the functional layer 3. This performs, for example, optical functions.

A cover layer 4 forms the closure.

Figure 2:
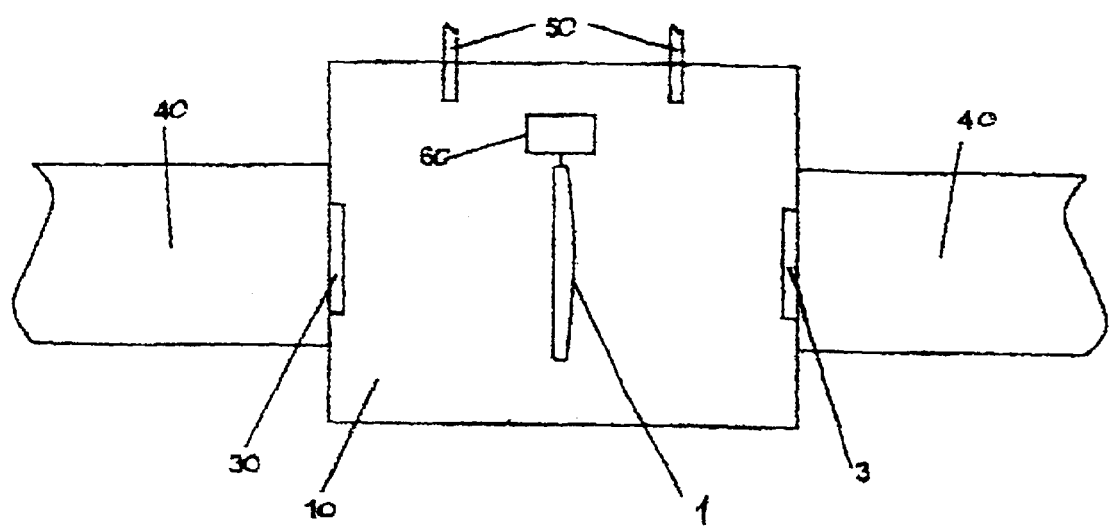
FIG. 2 shows in schematic representation a device for the coating of a substrate.

The device shown in FIG. 2 has the following components:

A coating reactor 10 carries the substrate 1. One perceives a microwave window 30, a microwave hollow conductor 40, a gas inlet 50 as well as a substrate holder 60.

1 Substrate
2 Interlayer
3 Functional layer
4 Cover layer
10 Coating reactor
30 Microwave window
40 Microwave guide
50 Gas inlet
60 Substrate holder

What is claimed is:

1. A lens, comprising:
   a concave-shaped substrate consisting essentially of a plastic material which is temperature-stable up to at least 100° C.; and
   a reflecting surface on said substrate constructed as a cold-light mirror consisting essentially of a plurality of layers of different refraction coefficients applied to said substrate by means of one of: a plasma impulse (Pi)

process, a chemical vaporization process (CVD) and a plasma-impulse chemical vaporization process (PICVD).

2. The lens of claim 1 wherein said plurality of layers is applied by means of a chemical plasma-impulse vaporization process (PICVD).

3. The lens of claim 2 wherein the total duration of the plasma action amounts to at least 1/1000 of the total action-free time span, and is at most equal to this time span.

4. The lens of claim 2 wherein the coating rate of the plasma action lasts between 0.1 and 10 ms.

5. The lens of claim 3 wherein the coating rate of the plasma action per time unit and per surface unit is >10 nanometers/mm.

6. The lens of claim 2 wherein said substrate is a material selected from the group consisting of:
Cycloolefin polyers (COP)
Cycloolefin copolymers (COC)
Polymethyyl methacrylate (PMMA)
a derivative of one of these materials.

7. A prism, comprising:
a concave-shaped substrate consisting essentially of a plastic material which is temperature-stable up to at least 100° C.; and
a reflecting surface on said substrate constructed as a cold-light mirror consisting essentially of a plurality of layers of different refraction coefficients applied to said substrate by means of one of: a plasma impulse (Pi) process, a chemical vaporization process (CVD) and a plasma-impulse chemical vaporization process (PICVD).

8. The prism of claim 7 wherein said plurality of layers is applied by means of a chemical plasma-impulse vaporization process (PICVD).

9. The prism of claim 8 wherein the total duration of the plasma action amounts to at least 1/1000 of the total action-free time span, and is at most equal to this time span.

10. The prism of claim 9 wherein the coating rate of the plasma action lasts between 0.1 and 10 ms.

11. The prism of claim 9 wherein the coating rate of the plasma action per time unit and per surface unit is >10 nanometers/mn.

12. The prism of claim 7 wherein said substrate is a material selected from the group consisting of:
Cycloolefin polyers (COP)
Cycloolefin copolymers (COC)
Polymethyyl methacrylate (PMMA)
a derivative of one of these materials.

* * * * *

UNITED STATES PATENT AND TRADEMARK OFFICE
CERTIFICATE OF CORRECTION

PATENT NO. : 6,918,676 B2
DATED : July 19, 2005
INVENTOR(S) : Christoph Moelle et al.

It is certified that error appears in the above-identified patent and that said Letters Patent is hereby corrected as shown below:

Column 5,
Line 14, delete "mm" and insert -- min --.

Column 6,
Line 17, delete "mn" and insert -- min --.

Signed and Sealed this

Eighteenth Day of October, 2005

JON W. DUDAS
*Director of the United States Patent and Trademark Office*